US006651204B1

(12) United States Patent
Rajsuman et al.

(10) Patent No.: US 6,651,204 B1
(45) Date of Patent: *Nov. 18, 2003

(54) MODULAR ARCHITECTURE FOR MEMORY TESTING ON EVENT BASED TEST SYSTEM

(75) Inventors: Rochit Rajsuman, Santa Clara, CA (US); Shigeru Sugamori, Santa Clara, CA (US); Hiroaki Yamoto, Santa Clara, CA (US)

(73) Assignee: Advantest Corp., Tokyo (JP)

( * ) Notice: Subject to any disclaimer, the term of this patent is extended or adjusted under 35 U.S.C. 154(b) by 321 days.

This patent is subject to a terminal disclaimer.

(21) Appl. No.: 09/585,831

(22) Filed: Jun. 1, 2000

(51) Int. Cl.[7] .......................... G01R 31/28; G06F 11/00
(52) U.S. Cl. ...................................................... 714/738
(58) Field of Search ......................................... 714/738

(56) References Cited

U.S. PATENT DOCUMENTS

| | | | | | |
|---|---|---|---|---|---|
| 5,682,472 | A | * | 10/1997 | Brehm et al. ................. | 714/25 |
| 6,181,616 | B1 | * | 1/2001 | Byrd .......................... | 365/201 |
| 6,219,289 | B1 | * | 4/2001 | Satoh et al. ................. | 365/201 |
| 6,292,415 | B1 | * | 9/2001 | Brehm ....................... | 365/201 |
| 6,314,034 | B1 | * | 11/2001 | Sugamori .................... | 365/201 |
| 6,320,812 | B1 | * | 11/2001 | Cook et al. ............. | 365/230.03 |

OTHER PUBLICATIONS

TDB–ACC–No: NN87055229, Title: Testcase Pattern Generation for Design Veritication Using a System Level Simulator, Publication–Data: IBM Technical Disclosure Bulletin, May 1987, US, vol. No.: 29, Issue No.: 12, p. No.: 5229–5232, Publication–DA.*

* cited by examiner

Primary Examiner—Albert Decady
Assistant Examiner—Joseph D. Torres
(74) Attorney, Agent, or Firm—Muramatsu & Associates

(57) ABSTRACT

An event based test system has a modular architecture for simultaneously testing a plurality of semiconductor devices (DUT) including memory and logic devices. The test system detects functional faults as well as physical faults in the DUT. The test system includes two or more tester modules each having a plurality of pin units, a main frame for accommodating the two or more tester modules, a test fixture for electrically connecting the tester modules and the DUT, a host computer for controlling an overall operation of the test system, and a data storage for storing a library of algorithmic test patterns and software tools for producing memory test patterns for testing memories. Memory test algorithm and information regarding the design and configuration of the memories to be tested are specified prior to the memory testing.

13 Claims, 5 Drawing Sheets

MODULAR ARCHITECTURE FOR MEMORY TESTING ON EVENT BASED TEST SYSTEM

FIELD OF THE INVENTION

This invention relates to an event based test system for testing semiconductor devices, and more particularly, to an event based test system having a modular architecture for simultaneously testing a plurality of semiconductor devices including memory and logic devices. The event based test system detects functional faults as well as physical faults in embedded memories and stand-alone memories.

BACKGROUND OF THE INVENTION

Semiconductor memories are considered to be the most vital microelectronic component of digital logic system design, such as computers and microprocessor based applications. In particular, embedded memories are the key components in the present day ICs. These embedded memories implement register files, FIFOs, data-cache, instruction-cache, transmit/receive buffers, storage for texture processing etc. At the present time, both embedded memories and stand-alone memory devices are tested by the cycle based test patterns generated by LSI tester's ALPG (algorithmic pattern generator) unit. It appears there is no method available today to test memory devices using event-based vectors. The present invention is directed to a method to conduct memory testing in the event environment. This method is applicable to both stand-alone memories and embedded memories.

In an event based test system, notions of events are employed, which are any changes of the logic state in signals to be used for testing a semiconductor device. For example, such changes are rising and falling edges of test signals or timing edges of strobe signals. The timings of the events are defined with respect to a time length from a reference time point. Typically, such a reference time point is a timing of the previous event (delta time). Alternatively, such a reference time point is a fixed start time common to all of the events (absolute time).

In an event based test system, since the timing data in a timing memory (event memory) does not need to include complicated information regarding waveform, vector, delay and etc. at each and every test cycle, the description of the timing data can be dramatically simplified. In the event based test system, as noted above, typically, the timing (event) data for each event stored in an event memory is expressed by a time difference between the current event and the last event. Since such a time difference between the adjacent events (delta time) is small, unlike a time difference from a fixed start point (absolute time), a size of the data in the memory can also be small, resulting in the reduction of the memory capacity.

During the IC design, designers create RTL (register transfer level) models of the memory devices such as embedded memories. These models are written in a high-level description language (HDL), such as Verilog or VHDL. Using these models, designers develop Verilog/VHDL simulation testbenches. The basic method in these simulation testbenches is to perform cycle by cycle memory read/write operations to ensure that data transaction to and from the memory is valid. These are known as functional testbenches. The test vectors in a functional testbench are in the event form and they can be used to perform functional testing using an event based test system as described in the U.S. patent application Ser. No. 09/340,371 and U.S. patent application Ser. No. 09/406,300 owned by the same assignee of this invention.

These functional test vectors detect functional errors in terms of the validity of data transaction to and from the memory under test. These test vectors are not developed to detect physical failures (such as memory cell stuck-at faults, coupling between two cells, bridging between lines, pattern sensitive fault, etc), and hence do not detect physical faults in the memories. In the presence of such faults, the data transaction to and from the memory under test may remain valid but the data itself can be erroneous. Hence, the testing of physical faults is required.

Secondly, if the functional testing of the memory is done on an event based test system such as described in the U.S. patent applications noted above, then it is also natural and cost-effective to test the memory in the event environment. Hence, a method is needed to generate memory test vectors in the event format and then to apply these event formed vectors to the memory.

SUMMARY OF THE INVENTION

Therefore, it is an object of the present invention to provide an event based semiconductor test system for generating memory test vectors in the event format for testing memory devices such as embedded memories and/or stand-alone memories.

It is another object of the present invention to provide an event based test system for detecting functional faults as well as physical faults in the memory device under test by generating memory test vectors in the event format with use of an algorithmic test pattern in the cycle format.

It is a further object of the present invention to provide an event based test system having a modular architecture for performing two or more different tests in parallel, at one of which is a memory test.

It is a further object of the present invention to provide an event based test system having a modular architecture in which two or more tester modules (pin-unit groups) operate independently from one another for performing two or more different or identical memory tests in parallel at the same time.

The event based test system of the present invention is comprised of two or more tester modules each having a plurality of pin units where each pin unit corresponds to a pin of a semiconductor device under test (DUT), a main frame for accommodating two or more tester modules, a test fixture provided on the main frame for electrically connecting between the tester modules and the DUT, a host computer for controlling an overall operation of the test system by communicating with the tester modules, and a data storage accessible by the host computer for storing a library of algorithmic patterns and software routines for producing memory test patterns for testing memories embedded in the DUT or stand-alone memories. In the present invention, each of the tester modules operates independently from one another, and memory test algorithm and information regarding the memories to be tested are specified in the host computer prior to the memory testing.

According to the present invention, the event based test system is capable of producing the memory test vectors in the event format for testing memory devices. Such memory test vectors can be produced with use of algorithmic patterns in the cycle based format. Thus, not only functional faults, but also physical faults of the memory devices under test can be detected. Since the event based test system has a modular architecture in which two or more tester modules operate independently from one another, two or more different or identical memory tests or two or more different types of test can be performed simultaneously. Both stand-alone and embedded memories can be tested in the event environment that is the same as the design simulation environment. The present invention also allows the use of any memory test algorithm to detect physical faults of the memory. By generating the memory vectors in the event form off-line, test productivity can also be improved considerably.

DETAILED DESCRIPTION OF THE PREFERRED EMBODIMENT

Figure 1:
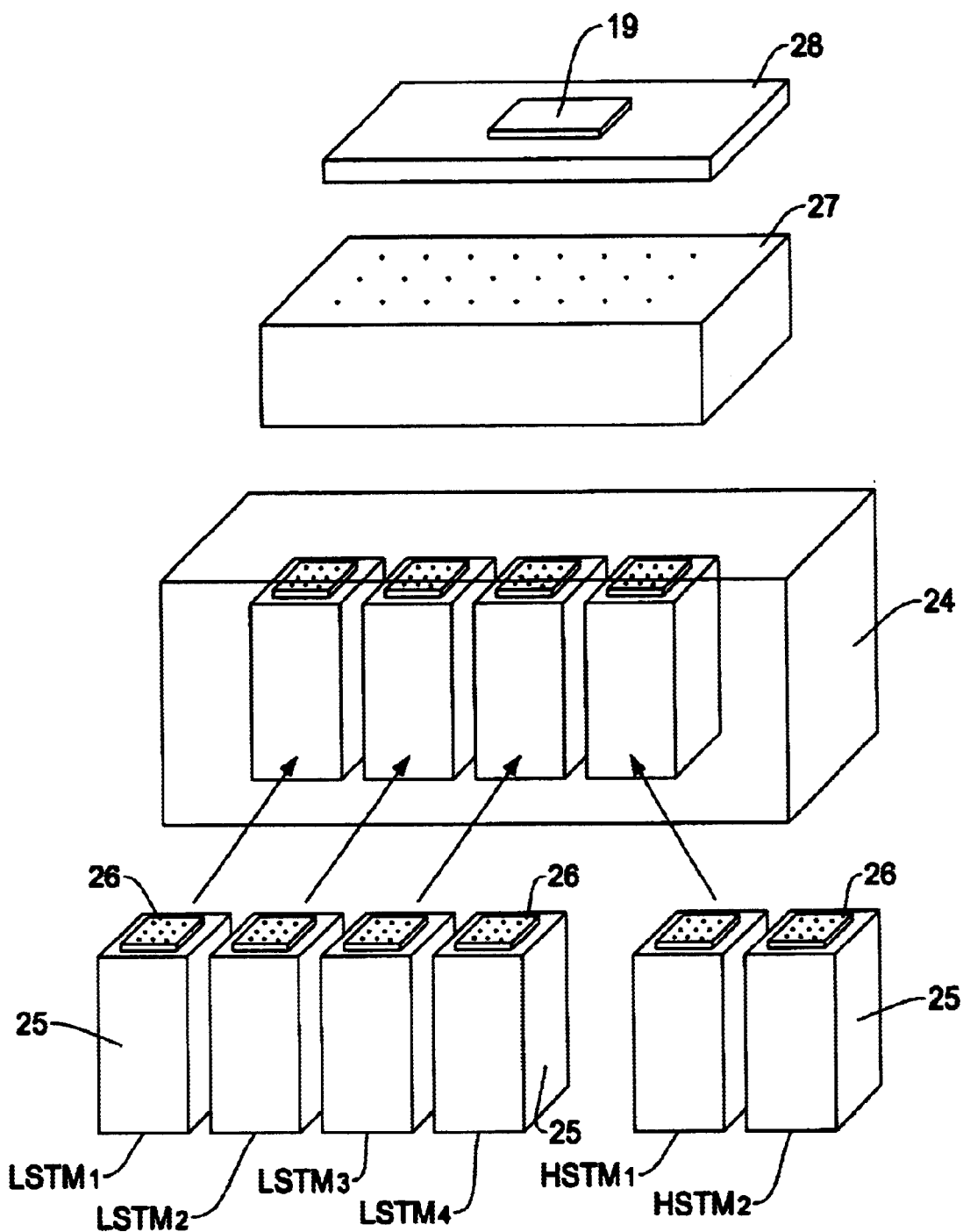
FIG. 1 is a schematic block diagram showing a basic structure of an event based test system having a modular architecture.

The event based test system of the present invention has a modular architecture as shown in FIG. 1 which is briefly described here. The U.S. patent application Ser. No. 09/434,821 "Module Based Flexible Semiconductor Test System" and U.S. patent application Ser. No. 09/439,865 "Event Tester Architecture for Mixed Signal Testing" owned by the same assignee of this invention include more detailed descriptions.

A test head (test system main frame) 24 is provided with a plurality of tester modules 25 depending on, for example, the number of pins of a test fixture 27, a type of the device to be tested, and the number of pins of the device to be tested. An interface (connection) specification between the test fixture and the test modules is standardized so that any tester modules can be installed in any positions in the test system main frame 24.

The test fixture 27 includes a large number of elastic connectors such as pogo-pins to electrically and mechanically connect the tester modules and a performance board 28. The device under test 19 is inserted in a test socket on the performance board 28, thereby establishing an electrical communication with the test system.

Typically, each of the tester module has a plurality of printed circuit boards (pin cards), such as 8 or 16 pin cards. Further, each of the pin cards is configured by a plurality of pin units, such as 16 or 32 pin units. For example, a high speed tester module (HSTM) 25 includes pin cards corresponding to 128 pin units (test pins or test channels) while a low speed tester module (LSTM) 25 installs printed circuit boards corresponding to 256 pin units. The pin units are assigned to a specific pin-unit group which is typically a pin card or a tester module. As will be described later, each pin unit is configured by an event tester for generating a test pattern by using event based data (event timing data) for a device pin and evaluating a response output from a device pin.

Each of the tester modules 25 is provided with an interface (connector) 26. The connector 26 is so arranged to fit to the standard specification of the test fixture 27. For example, in the standard specification of the test fixture 27, a structure of connector pins, impedance of the pins, distance between the pins (pin pitch), and relative positions of the pins are specified for the intended test head. By using the interface (connector) 26 which matches the standard specification on all of the tester modules, test systems of various combinations of the tester modules can be freely established.

Because of the configuration of FIG. 1, a test system of optimum cost/performance which matches the purpose of the test and the types of devices under test can be established. Further, improvement of the performance of the test system can be achieved by replacing one or more test modules, thus, an overall life time of the test system can be increased. Moreover, the test system of the present invention can accommodate a plurality of test modules whose performances are different from the other, and thus, the desired performance of the test system can be achieved directly by the corresponding test module. Therefore, the performance of the test system can be easily and directly improved.

Figure 2:
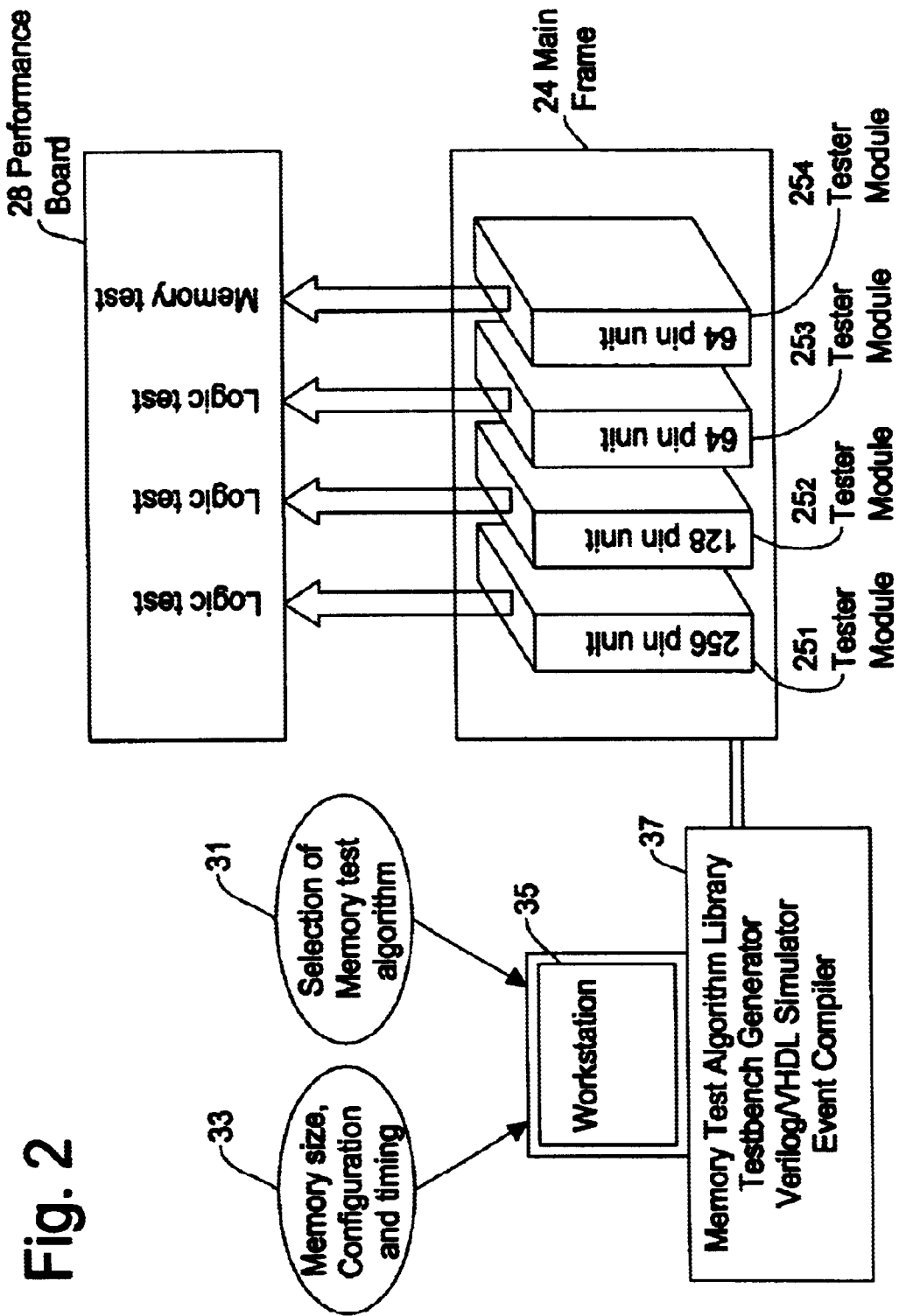
FIG. 2 is a schematic block diagram showing a basic concept of the event based memory test system of the present invention having a modular architecture.

By using the basic structure of FIG. 1, an event based memory test system of the present invention is configured as shown in FIG. 2. This modular architecture in the event based test system allows assigning a pin-unit group for one task while another pin-unit group performs a different task. Typically, a pin-unit group is a tester module although it is not necessarily limited to the tester module. The structure of all pin units in the pin-group units (modules) is identical, however, the pin-unit groups operate independently from one another. All pin units generate event waveforms and compare DUT response based upon pin specific information in the input event file. This modular configuration allows to assign a pin-unit group to a unique group of DUT pins and to test that DUT pin group.

The example of FIG. 2 is a 512-pin modular event based test system to test logic and memory devices or other functional blocks. The main frame 24 installs tester modules $25_1$–$25_4$ each having different number of pin units as illustrated in the drawing to cover up to 512 pins of anticipated devices under test. The tester module $25_1$ has 256 pin units, the tester module $25_2$ has 128 pin units, and the tester modules $25_3$ and $25_4$ respectively have 64 pin units. The event based test system of FIG. 2 further includes a host computer 35 which is for example a Unix or NT based workstation, and a memory 37 for storing a library of memory test algorithm as well as various software and data. The host computer 35 controls an overall operation of the event based test system.

The event based test system of FIG. 2 is especially advantageous in testing a semiconductor device (DUT) having multiple functional blocks such as a system-on-chip (SOC) IC. Assuming that the DUT on a performance board 28 has three logic functional blocks and one memory block, the minimum sized tester module $25_4$ can be assigned for memory testing while the other tester modules $25_1$–$25_3$ can be assigned to three different groups of DUT pins for logic testing.

For the logic pin-unit groups, event test data is obtained in a VCD (value change dump) format, i.e., event format, from the design simulation testbench. However, as noted above with respect to the background of the invention, memory test data for physical faults is not available in the event form although memory test data for detecting functional faults is available. This is because designers do not write Verilog/VHDL testbenches to detect physical faults in the memories. Traditionally, cyclized memory test vectors generated by the memory ALPG (algorithmic pattern generator) unit of the tester have been used to test memory devices.

Therefore, in the present invention, to overcome the difficulty as mentioned above and to test memory devices in the event environment, a library of memory test algorithms is developed and installed in the memory 37 in the test system. In addition to this library of the test algorithm, a testbench generator, a Verilog/VHDL simulator and an event compiler also reside in the memory 37 at the host computer 35, for continuously conducting all operations in an on-line fashion. The test algorithm includes various memory test patterns including algorithmic test patterns such as checkerboard, marching, walking, and galloping patterns.

In the method of the present invention, a user selects one or more types of test algorithm from the library of test algorithm (numeral 31) and also provides inputs regarding the information on the memory to be tested, such as memory size, configuration and timing (numeral 32). Based upon this inputs, the testbench generator generates a testbench for the memory that is used by the Verilog/VHDL simulator to generate memory test patterns.

Namely, the testbench generator is a software tool for producing testbench (test data) based on the specified test pattern algorithm and the information. The testbench includes address data, write data, and control data produced in conformity with the pin allocations, memory size and timings such as delays of the memory to be tested. The sequence of the testbench (test data) is determined by the test pattern algorithm specified by the user.

The integrity of the testbench is evaluated by the Verilog/VHDL simulator to obtain fault free test patterns. The Verilog/VHDL simulator is a logic simulator for applying the testbench to a device model (the memory to be tested) so as to check whether the testbench (algorithmic test pattern) can correctly test the device model. If an error is found, such information is feedbacked to the testbench generator and a corrected version of the testbench will be reproduced by the testbench generator. Thus, the Verilog/VHDL simulator ultimately provides a validated memory test pattern to the event compiler.

The event compiler converts these patterns into the event format to be transferred to the test modules 25. The compiler methodology to convert VCD data (simulator output data) into event format was described in U.S. patent application Ser. No. 10/089,137 "Test Language Conversion Method" owned by the same assignee of this invention. The host computer 35 then sends this event test data to the pin-unit group (tester module 25₄) that is assigned for the memory testing.

This event data is converted into physical waveforms by the pin units in the tester module 25₄ which apply the waveforms to the memory block under test, receive results from the memory block under test and compare the results with the input data to determine the presence of a fault. Because the pin-unit groups (tester modules) can operate independently from one another, the tester modules 25₁–25₃ perform logic testing of the logic blocks of DUT in parallel with the memory testing performed by the tester module 25₄.

Figure 3:
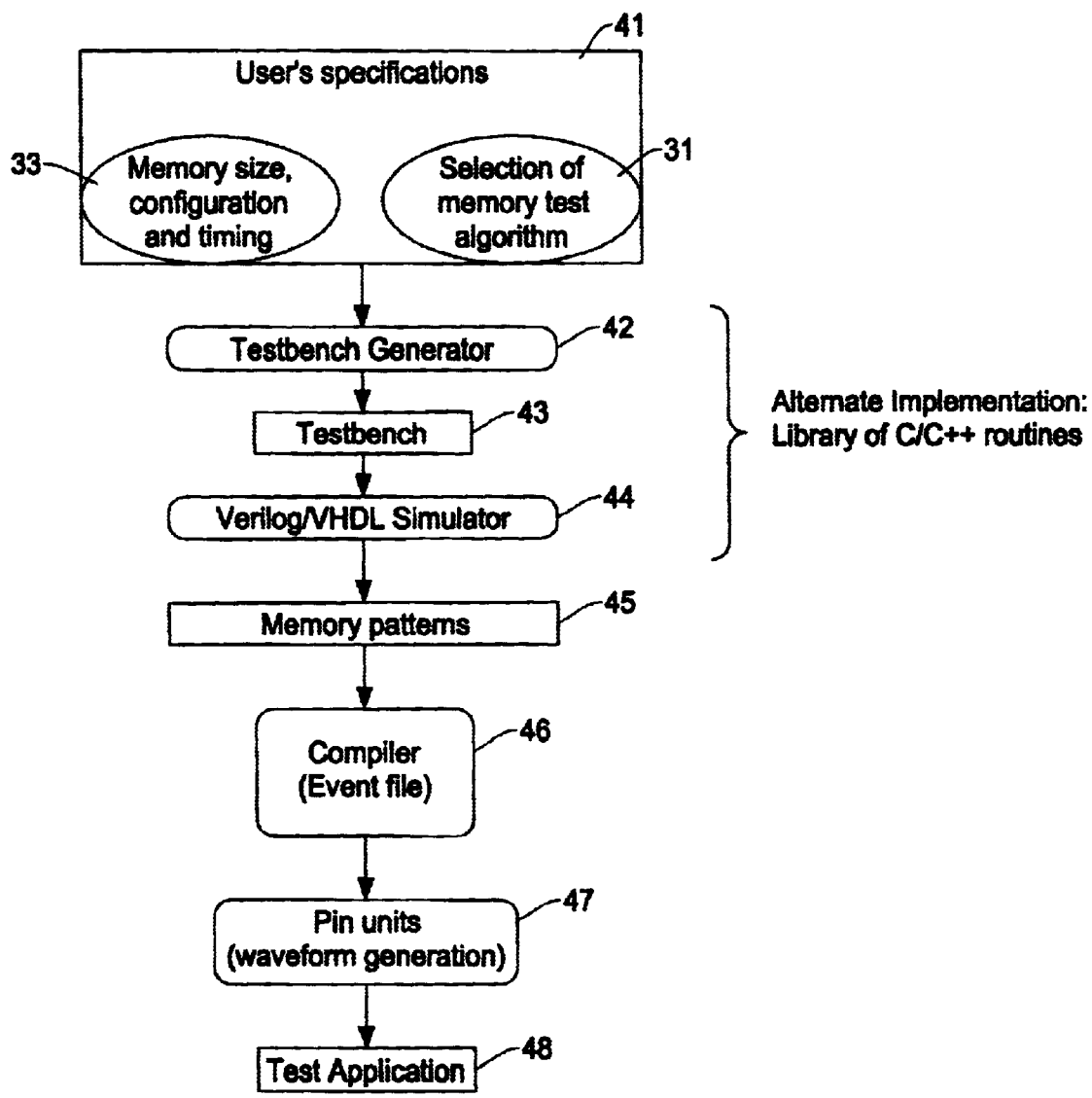
FIG. 3 is a flow chart showing a sequence of operation in the event based memory test system of the present invention.

This sequence of operation in this method is illustrated in FIG. 3. In the example of FIG. 3, the user inputs the specifications regarding a memory under test in the step 41. As described in the foregoing, the memory under test can be an embedded memory or a stand-alone memory. The user specification includes the selection of the test pattern algorithm out of the library of test pattern algorithms and the information regarding the memory under test including the memory size such as memory capacity, configuration such as pin allocations, and timing such as delays.

In the step 42, the testbench generator generates a testbench for the memory under test based on the specified test pattern algorithm and the various specification regarding the memory under test. As noted above, the testbench includes address data, write data, and control data to be conformity with the pin allocations, memory size and access speed of the memory to be tested. The sequence of the testbench (test data) is determined by the test pattern algorithm such as a checkerboard pattern or a ping-pong pattern and the like specified by the user. In other words, the test data in the event format is modified its sequence by the traditional algorithmic test pattern, thereby detecting both physical faults and functional faults of the memory under test. Thus, the testbench is produced in the step 43.

In the step 44, the testbench is received by the Verilog/VHDL simulator to obtain fault free test patterns. The Verilog/VHDL simulator performs a test simulation by applying the testbench to the device model (the memory to be tested) to validate the testbench. Thus, the Verilog/VHDL simulator ultimately produces a fault free memory test pattern in the step 45.

In the step 46, the compiler converts the validated memory test pattern into the event format to create event files of test data. In the step 47, the host computer 35 sends this event test data to the pin-unit group (tester module 25₄) that is assigned for the memory testing. The event test data is converted into physical test waveforms, such as address signals, write data, and control signals, by the pin units in the tester module 25₄. In the step 48, the tester module applies the test waveforms to the memory block under test, receive results from the memory block under test and compare the results with the input data to determine the presence of a fault.

Figure 4:
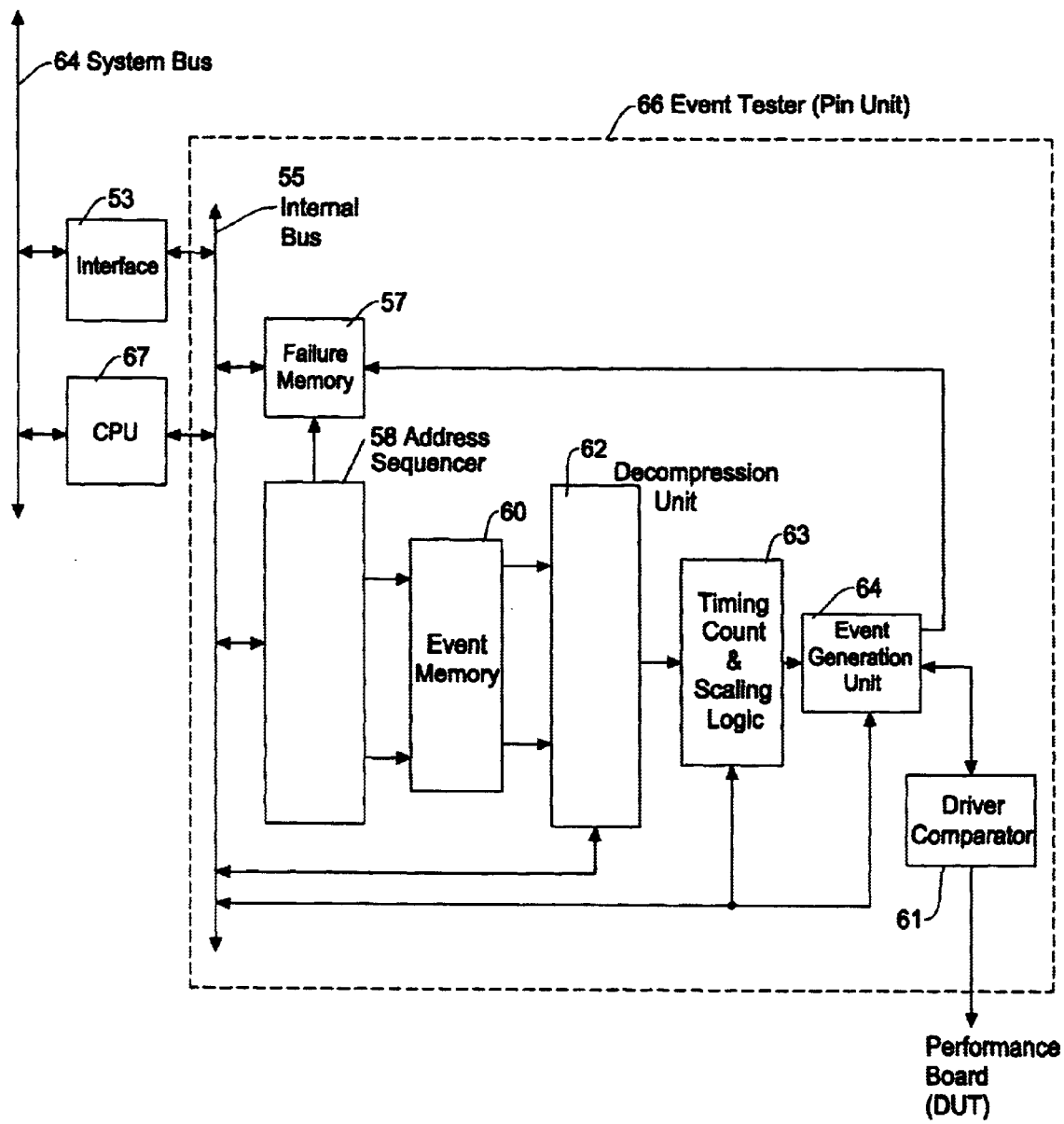
FIG. 4 is a block diagram showing an example of structure in the event tester (pin unit) in the test module of the present invention.

As noted above, each pin unit is configured by an event tester, an example of which is illustrated in FIG. 4. The event tester of FIG. 4 includes an interface 53 and a processor 67 which are connected to the host computer 35 through a system bus 64. The interface 53 and the CPU are also connected to an internal bus 55 in the event tester 66. The interface 53 is used, for example, for transferring data from the host computer 35 to a register (not shown) in the event tester board to assign the event testers to the input/output pins of the device under test. For example, when the host computer sends a group assigning address to the system bus, the interface 53 interprets the group assigning address and allows the data from the host computer to be stored in the register in the specified event tester board.

The processor 67 is provided, for example, in each pin card or each tester module, and controls the operations in the event tester board including generation of events (test patterns), evaluation of output signals from the device under test, and acquisition of failure data. The processor 67 can be provided at each pin unit. Further, the processor 67 may not always necessary be provided in the pin card or tester module, but the same control functions can be made directly by the host computer 35 to the event tester boards.

An address controller 58 is, for example, in the most simple case, a program counter. The address controller 58 controls the address supplied to the failure data memory 57 and the event memory 60. The event timing data is transferred to the event memory 60 from the host computer 35 as a test program and stored therein.

The event memory 60 stores the event timing data as noted above which defines timing of each of the events (change points from "1" to "0" and from "0" to "1"). For example, the event timing data is stored as two types of data, one of which shows integer multiples of a reference clock cycle while the other shows fractions of the reference clock cycle. Preferably, the event timing data is compressed before being stored in the event memory 60.

The pin unit (event tester) further includes a decompression unit 62, a timing count/scaling logic 63, and an event generator 64. The decompression unit 62 decompresses (reproduces) the compressed timing data from the event memory 60. The timing count/scaling logic 63 produces time length data of each event by summing or modifying the event timing data. The time length data expresses the timing of each event by a time length (delay time) from a predetermined reference point.

The event generator 64 produces a test pattern based on the time length data and provides the test pattern to the device under test 19 through the driver/comparator (pin electronics) 61. Thus, a particular pin of the device under test 19 is tested by evaluating the response output therefrom. The driver/comparator 61 is mainly formed with a driver which drives the test pattern to be applied to the particular device pin and a comparator which determines a voltage level of an output signal of a device pin resultant from the test pattern and compares the output signal with the expected logic data.

There are many possible alternative implementations, some of which are described below:

In a first embodiment, all the operations as shown in FIG. 3 can be conducted off-line and neither the testbench generator nor the Verilog/VHDL simulator and the event compiler need to be installed in the memory 37 at the host computer 35. Developing the memory test patterns off-line can significantly improve the testing cost during IC manufacturing. In this situation, memory test patterns in the event form are directly loaded onto the event based test system and applied to the DUT.

In a second embodiment, instead of using the testbench generator, library of test algorithm and Verilog/VHDL simulator, a library of software routines written in a high-level language such as C/C++ can be used to generate memory patterns. Thus, the steps 42, 43 and 44 shown in FIG. 3 can be replaced with this alternative implementation. Since high level languages such as C/C++ are easier for engineers to write and debug the codes. Further, codes in C/C++ language are easily complied on the workstation 35 or a host computer. In using C/C++, it is also easy to compile if the development is done off-line.

This library of C/C++ routines can reside in the memory of the host computer 35 (replacing the library of test algorithms, testbench generator and Verilog/VHDL simulator in FIG. 1), or they can be used off-line as mentioned above regarding the first embodiment to develop memory test patterns.

Figure 5:
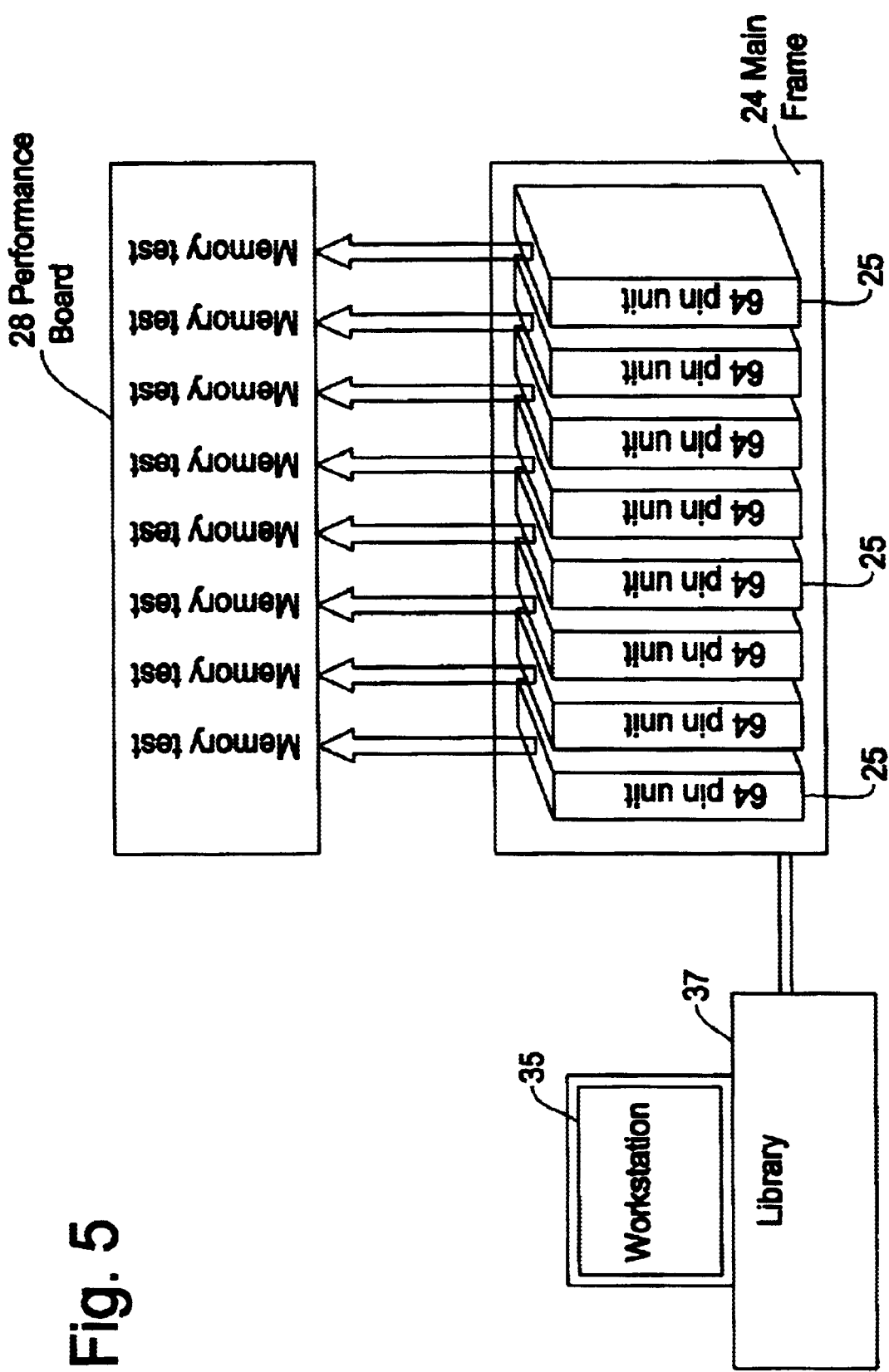
FIG. 5 is a schematic diagram showing an example of configuration of modular architecture event based test system for testing multiple memory devices.

In a third embodiment, instead of assigning one pin-unit group to memory testing and others to logic testing, all pin-unit groups can be assigned to test memory devices. In such a configuration, multiple memory devices can be tested simultaneously. This implementation is specifically useful to test stand-aline memories. For example, using the same number of pins as in FIG. 2 (512-pins), 8 memory devices can be tested in parallel at the same time as shown in FIG. 5. This configuration is particularly useful during wafer-sort test to test multiple chips in parallel, identify the memory failures and perform redundancy analysis and repair. Further parallelism in testing can be obtained by assigning dual-DUT or quad-DUT per pin-group of the event test system. For example, with quad-DUT per pin group of test modules 25 as shown in FIG. 5, 32 memory devices on the performance board 28 can be tested simultaneously.

According to the present invention, the event based test system is capable of producing the memory test vectors in the event format for testing memory devices. Such memory test vectors can be produced with use of algorithmic patterns in a cycle based format. Thus, not only functional faults, physical faults of the memory devices under test can be detected. Since the event based test system has a modular architecture in which two or more tester modules operate independently from one another, two or more different or identical memory tests or two or more different kinds of test can be performed simultaneously. Both stand-alone and embedded memories can be tested in the event environment that is the same as the design simulation environment. The present invention also allows the use of any memory test algorithm to detect physical faults of the memory. By generating the memory vectors in the event form off-line, test productivity can also be improved considerably.

Although only a preferred embodiment is specifically illustrated and described herein, it will be appreciated that many modifications and variations of the present invention are possible in light of the above teachings and within the purview of the appended claims without departing the spirit and intended scope of the invention.

what is claimed is:

1. An event based test system for testing semiconductor devices, comprising:

two or more tester modules each having a plurality of pin units where each pin unit corresponds to a device pin of a semiconductor device under test (DUT) where each pin unit is configured as an event tester;

a main frame for accommodating the two or more tester modules therein;

a test fixture provided on the main frame for electrically connecting between the tester modules and the DUT;

a host computer for controlling an overall operation of the test system by communicating with the tester modules; and a data storage accessible by the host computer for storing a library of algorithmic test patterns and software tools for producing memory test patterns for testing an embedded memory in the DUT or a stand-alone memory;

wherein each of the tester modules operates independently from one another, and wherein memory test algorithm and information regarding design and configuration of the memory to be tested are specified in the host computer prior to testing the embedded memory or stand-alone memory, and wherein the memory test patterns are generated based on test data created in a design stage of the memory to be tested where a sequence of the test data is modified by an algorithmic test pattern selected for the memory, wherein the software tools in the data storage are software routines written in a high level language including C/C++ languages.

2. An event based test system as defined in claim 1, wherein a part of the plurality of pin units in the tester modules is assigned to logic testing of the DUT while other part of the plurality of pin units is assigned to memory testing.

3. An event based test system as defined in claim 1, wherein all of the plurality of pin units in the tester modules are assigned to memory testing so as to test a plurality of memories simultaneously by the event based test system.

4. An event based test system as defined in claim 1, wherein each of the tester modules has a plurality of pin units a total number of which is identical to or different from that of other tester module.

5. An event based test system as defined in claim 1, wherein specification for connecting between the tester modules and the test fixture is standardized so that the tester modules can be installed in any slots in the main frame.

6. An event based test system as defined in claim 1, further comprising a performance board provided on the test fixture and having a mechanism for mounting the DUT thereon, and wherein the test fixture has a connection mechanism for electrically connecting between the performance board and the tester modules.

7. An event based test system as defined in claim 1, wherein each of the tester modules includes a plurality of pin cards where each of the pin cards includes a plurality of the pin units.

8. An event based test system as defined in claim 1, wherein a user specifies the memory test algorithm out of the library of algorithmic test patterns and the information regarding the design of the memory to be tested including size, configuration and timing of the memory to be tested.

9. An event based test system as defined in claim 1, wherein the software tools in the data storage includes a testbench generator for generating a testbench based on the memory test pattern specified in the host computer and the information regarding the design and configuration of the memory to be tested provided to the host computer, and a logic simulator for simulating the testbench generated by the testbench generator to confirm validity of the testbench.

10. An event based test system as defined in claim 1, wherein each of the pin unit is comprised of:

an event memory for storing event timing data for each event for producing a test pattern;

an address sequencer for providing address data to the event memory to read the timing data therefrom;

means for producing the test pattern based on the timing data from the event memory; and a pin electronics for transferring the test pattern to a corresponding pin of the DUT and receiving a response output signal from the DUT.

11. An event based test system for testing semiconductor devices, comprising:

two or more tester modules each having a plurality of pin units where each pin unit corresponds to a DUT pin of a semiconductor device under test (DUT), each of the tester modules operating independently from one another, and each pin unit being configured as an event tester;

a main frame for accommodating the two or more tester modules therein;

a test fixture provided on the main frame for electrically connecting the tester modules and the DUT;

a host computer for controlling an overall operation of the test system by communicating with the tester modules; and means for producing event data off-line to generate a memory test pattern by specifying a test pattern algorithm and information regarding the design and configuration of a memory under test which is an embedded memory in the DUT or a stand-alone memory where the event data is created in a design stage of the memory under test through logic simulation;

wherein the event data for generating the memory test pattern is provided to the host computer and is transferred to the tester module prior to testing the memory under test, and wherein the memory test pattern is generated based on the event data of the memory under test where a sequence of the event data is modified by an algorithmic test pattern selected for the memory under test, and wherein the means for producing the event data off-line are software routines written in a high level language including C/C++ languages.

12. An event based test system as defined in claim 11, wherein the means for producing the event data off-line includes a testbench generator for generating a testbench based on the memory test pattern specified in the host computer and the information regarding the design and configuration of the memory to be tested provided to the host computer, and a logic simulator for simulating the testbench generated by the testbench generator to confirm validity of the testbench.

13. An event based test system as defined in claim 11, wherein each of the pin unit is comprised of:

an event memory for storing event timing data for each event for producing a test pattern;

an address sequencer for providing address data to the event memory to read the event timing data therefrom;

means for producing the test pattern based on the timing data from the event memory; and a pin electronics for transferring the test pattern to a corresponding pin of the DUT and receiving a response output signal from the DUT.

* * * * *